(12) United States Patent
Blasco Claret et al.

(10) Patent No.: US 7,619,461 B2
(45) Date of Patent: Nov. 17, 2009

(54) SWITCHING CIRCUIT WHICH IS USED TO OBTAIN A DOUBLED DYNAMIC RANGE

(75) Inventors: Jorge Vicente Blasco Claret, Valencia (ES); José Luis Camps Soriano, Xirivella (ES); José Luis González Moreno, Valencia (ES); Francisco José Andrés Navarro, Valencia (ES)

(73) Assignee: Diseño de Sistemasen Silicio, S.A., Paterna (Valencia) (ES)

( * ) Notice: Subject to any disclaimer, the term of this patent is extended or adjusted under 35 U.S.C. 154(b) by 116 days.

(21) Appl. No.: 11/667,840

(22) PCT Filed: Oct. 26, 2005

(86) PCT No.: PCT/ES2005/000575

§ 371 (c)(1),
(2), (4) Date: Jan. 23, 2008

(87) PCT Pub. No.: WO2006/053916

PCT Pub. Date: May 26, 2006

(65) Prior Publication Data

US 2009/0002047 A1      Jan. 1, 2009

(30) Foreign Application Priority Data

Nov. 16, 2004   (ES) ................................. 200402748

(51) Int. Cl.
H03K 17/56 (2006.01)

(52) U.S. Cl. ..................................................... 327/419

(58) Field of Classification Search ................. 327/419, 327/427, 434, 478
See application file for complete search history.

(56) References Cited

U.S. PATENT DOCUMENTS

| 2003/0117817 | A1 | 6/2003 | Turvey et al. |
| 2005/0012541 | A1* | 1/2005 | Watanabe .................... 327/419 |
| 2006/0267666 | A1* | 11/2006 | Toda ........................... 327/427 |

FOREIGN PATENT DOCUMENTS

| EP | 1 246 363 | 10/2002 |
| JP | 57173228 | 10/1982 |
| JP | 6152376 | 5/1994 |
| SU | 438109 | 7/1974 |
| WO | 2004/038911 | 5/2004 |

\* cited by examiner

*Primary Examiner*—Lincoln Donovan
*Assistant Examiner*—William Hernandez
(74) *Attorney, Agent, or Firm*—Wenderoth, Lind & Ponack, LLP.

(57) ABSTRACT

It permits switching signals with a peak level equal to the source voltage by means of a transistor, the peak to peak level being double the source.

It is characterized by the connection of a transistor (17) to the signal source (10) and a load (19) by means of a series of capacitors (11, 18), resistors (15, 16) and an inductor (12) that form the circuit of the invention, and by the application of two complementary control voltages (13 and 14) in order to control the off and on states of the switch circuit.

25 Claims, 7 Drawing Sheets

SWITCHING CIRCUIT WHICH IS USED TO OBTAIN A DOUBLED DYNAMIC RANGE

OBJECT OF THE INVENTION

As expressed in the title of this specification, the present invention refers to a switch circuit to obtain a duplicate dynamic range that is applicable to multiple communications systems, and especially applicable to communications systems wherein the output voltage is higher than the source voltage.

Signals with a dynamic range up to double the value of the source voltage can be switched with the switch circuit of the invention.

BACKGROUND OF THE INVENTION

In most electronic systems it is advantageous to have means to isolate or connect a load to a signal source. This is especially advantageous in telecommunications systems, for the injection as well as for the extraction of the signal from the communications means.

These functions are carried out in the prior art by means of switches and multiple ways of carrying them out are known, with MOSFET transistors as well as with BJT transistors.

Several examples of switches would be those disclosed in the patents US200311787 "Switch control circuit" and EP1246363 "High frequency switch circuit, and communications terminal using the same" that describe switch circuits that solve problems specific to the use thereof. The problem of curling is solved in the first patent within the band of the insertion losses in the active state of a high frequency switch, whereas the second patent solves the problem of uncontrolled switching due to noise in the load, for example, due to lightning or other electric phenomena. None of these two patents anticipate or solve the technical problem in this invention, that is to say, switching signals at peak to peak level double the source.

In general, switches known in the prior part suffice in multiple uses of telecommunications systems since the output signal of the amplifier will have a maximum peak-peak level that will be equal to the source voltage. A switching step with a higher voltage range is unnecessary. Unfortunately, this is not valid in the case wherein some power combination circuit, such as, the power combiner circuit described in patent WO2004/038911, is used. In this case, the output peak-peak voltage can clearly be higher than the source voltage. The only solution in the prior art would be to increase the source voltage, which would imply a higher expense in the manufacture and use of this type of circuit.

The switch circuit of the invention makes it possible to achieve output peak to peak voltage ranges higher than the source voltage (doubling this range) with the need to alternate said source voltage, which implies a very effective solution from an economic point of view for switching high power signals.

DESCRIPTION OF THE INVENTION

In order to achieve the objectives and to avoid the drawbacks indicated above, the invention consists of a switch circuit that comprises a transistor with three terminals, an inductor, two resistors and two capacitors, located between a source signal ($V_{source}$) and an external load ($Z_{load}$). This circuit is characterized by connecting the voltage source ($V_{source}$) to the first terminal of the transistor by means of a capacitor, by connecting an input of complementary control voltage ($\overline{VControl}$) to the first terminal of the transistor by means of an inductor, by connecting an input of the control voltage ($V_{control}$) to the second terminal of the transistor by means of a resistor, by connecting the same input for the control voltage ($V_{control}$) to the third terminal of the transistor by means of another resistor, and by connecting the third terminal of the transistor to the load ($Z_{load}$) by means of a capacitor. Likewise, a control voltage ($V_{control}$) and its complementary voltage ($\overline{VControl}$) are applied. Thanks to all this, a switch circuit with a dynamic range that is double the range of source voltage is obtained.

In an embodiment of the invention, the transistor used is a reverse biased BJT transistor, whereas in another embodiment, the transistor used is a direct biased BJT transistor.

The invention provides for, in an alternate embodiment, that the transistor used is an N channel MOSFET transistor, and in another alternative embodiment, that the transistor used is a P channel MOSFET transistor.

For the cases wherein the transistor used is an BJT NPN or N channel MOSFET transistor, when the control voltage ($V_{control}$) is equal to the highest limit of the source voltage, the complementary control voltage ($\overline{VControl}$) is equal to the lowest limit of the source voltage and the switch is on, whereas when the control voltage ($V_{control}$) is equal to the lowest limit, the complementary control voltage ($\overline{VControl}$) is equal to the highest limit and the switch is off.

With regard to the cases wherein the transistor used is a BJT PNP or a P channel MOSFET transistor, when the control voltage ($V_{control}$) is equal to the highest limit of the source voltage, the complementary control voltage ($\overline{VControl}$) is equal to the lowest limit of the source voltage and the switch is off, whereas when the control voltage ($V_{control}$) is equal to the lowest limit, the complementary control voltage ($\overline{VControl}$) is equal to the highest limit and the switch is on.

On the other hand, in one embodiment, the source applied to the switch circuit with direct bias BJT, with reverse bias BJT or else with a MOSFET transistor is unipolar, whereas in another embodiment said source is bipolar, maintaining the usefulness of the circuit in any case, in other words, achieving a dynamic switching range that is double the source voltage range.

Hereinafter to provide a better understanding of this specification and forming an integral part thereof, some figures wherein the object of the invention has been represented in an illustrative and non-restrictive manner are attached hereto.

DESCRIPTION OF SEVERAL EMBODIMENTS OF THE INVENTION

A description of several embodiments of the invention is made hereinafter, making reference to the numbers used in the figures.

Figure 1:
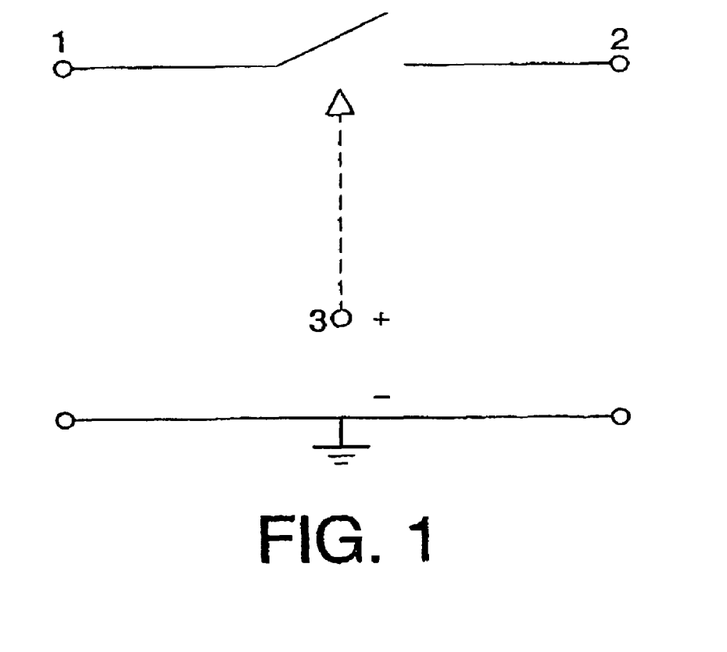
FIG. 1 is a diagram of an ideal voltage controlled switch.

Before dealing with the specific case of the double dynamic range switch circuit, it is necessary to present the function and usefulness of switches. Use of switches, whose main function is to isolate at certain moments and to connect at other moments a load to a signal source, is known in the prior art. FIG. 1 is a diagram of an ideal voltage controlled switch. In this figure, terminals (1) and (2) are the terminals to switch whereas (3) is the control terminal.

This switch can be found in two different states depending on the state of the control terminal (3). When the switch is on, the voltage difference between points 1 and 2 is zero and the current that passes through ($I_1$) can have any value depending on the source voltage and on the load.

$$V_1 - V_2 = V_{12} = 0$$

When the switch is off, the current is zero and the voltage between the two terminals can have any value:

$$I_1 = I_2 = 0$$

Figure 2:
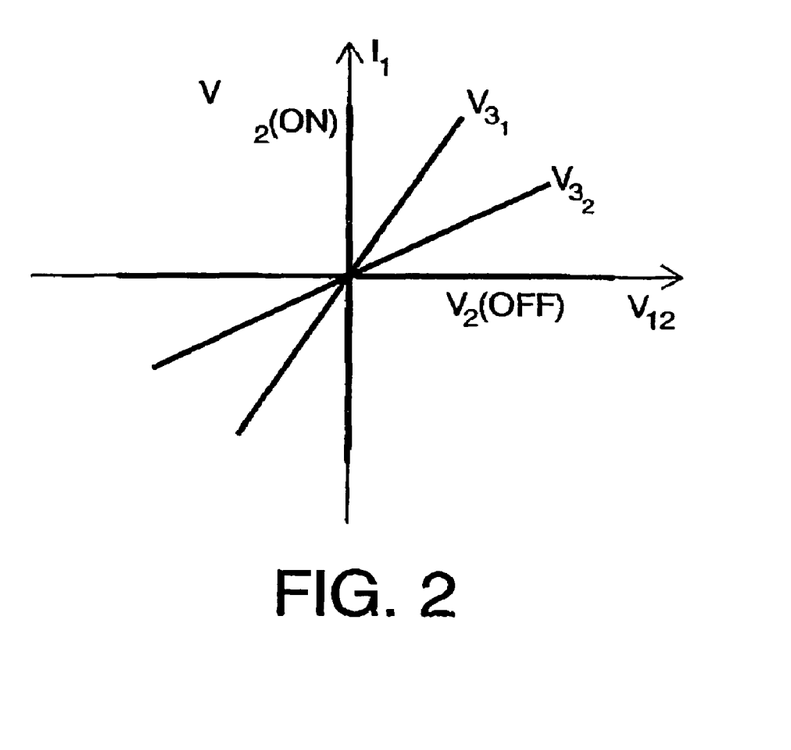
FIG. 2 shows the characteristic curve of an ideal voltage controlled switch.

FIG. 2 shows the characteristic curve of an ideal voltage controlled switch. The voltages $V_{3_1}$ and $V_{3_2}$ in said figure are between the off values $V_3$ and on values $V_3$, and from these values one can see the ratio between the voltage between the terminals (1) and (2) ($V_{12}$) and the current in point 1 ($I_1$).

Figure 3:
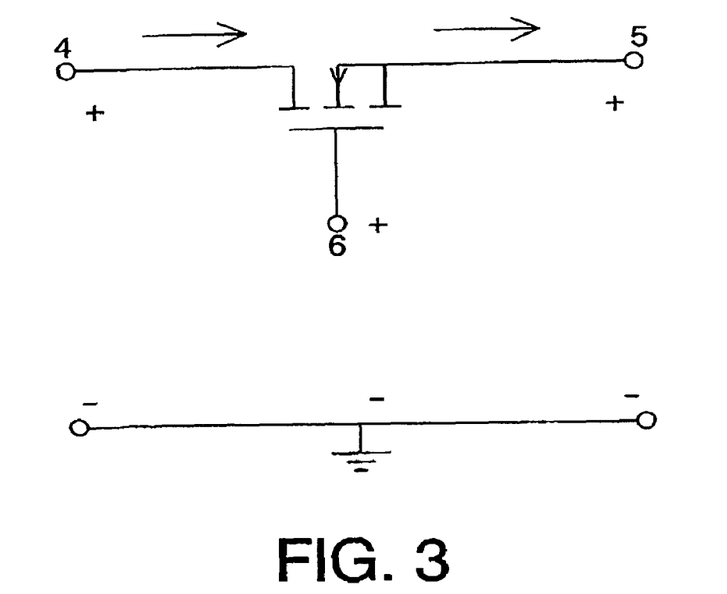
FIG. 3 is a conventional diagram of a switch made by a MOSFET transistor.

A realer approximation to the ideal switch shown above can be carried out by means of a MOSFET transistor, as shown in FIG. 3. The voltages and currents of the different terminals in this figure correspond with the voltages of the terminals of the transistor (Drain D, Supply S and Gate G):

$$V_{45} = V_{DS} \; V_6 = V_G \; I_4 = I_D$$

In an n channel MOSFET, the voltage at the gate ($V_G$) should exceed the drain or source voltage in the threshold value ($V_T$) so that the switch is on. In this way, if the source voltage ($V_S$) is zero, the switch will be on when $V_{GS} > V_T$, whereas it will be off when $V_{GT} < V_T$.

In this case the input voltage range in the terminals (4) (D) and (5) (S) depends on the control voltage used in terminal 6 (G). Assuming that the control voltage is $+V_{dd}$ when it is on and $-V_{dd}$ when it is off, the highest and lowest limits of the input voltage range will be the following:

$$V_{Dmax} = +V_{dd} - V_T$$

$$V_{Dmin} = +V_{dd} - V_T$$

On the one hand, the highest limit of the voltage range is determined by the state wherein the switch is on. If the input voltage into the switch exceeds this value, the switch will no longer be on since the condition $V_{GS} > V_t$ ($v_{GD} > V_T$) is not met:

$$V_{GD} = V_G - V_D > V_T; \; ON \; V_G = +V_{dd}; \; +V_{dd} - V_D > V_T$$

On the other hand, the lowest limit of the voltage range is determined by the state wherein the switch is off. If the input voltage into the switch exceeds this value, the switch will no longer be off since the condition $V_{GS} > V_t$ ($V_{GD} < V_T$) is not met:

$$V_{GD} = V_G - V_D < V_T; \; OFF \; V_G = -V_{dd}; \; +V_{dd} - V_D < V_T$$

In this case, the total range of the switch carried out with a MOSFET transistor is $[-V_{dd} - V_T, +V_{dd} - V_T]$ (approximately $[-V_{dd}, +V_{dd}]$) with a dual source $\pm V_{dd}$.

Figure 4:
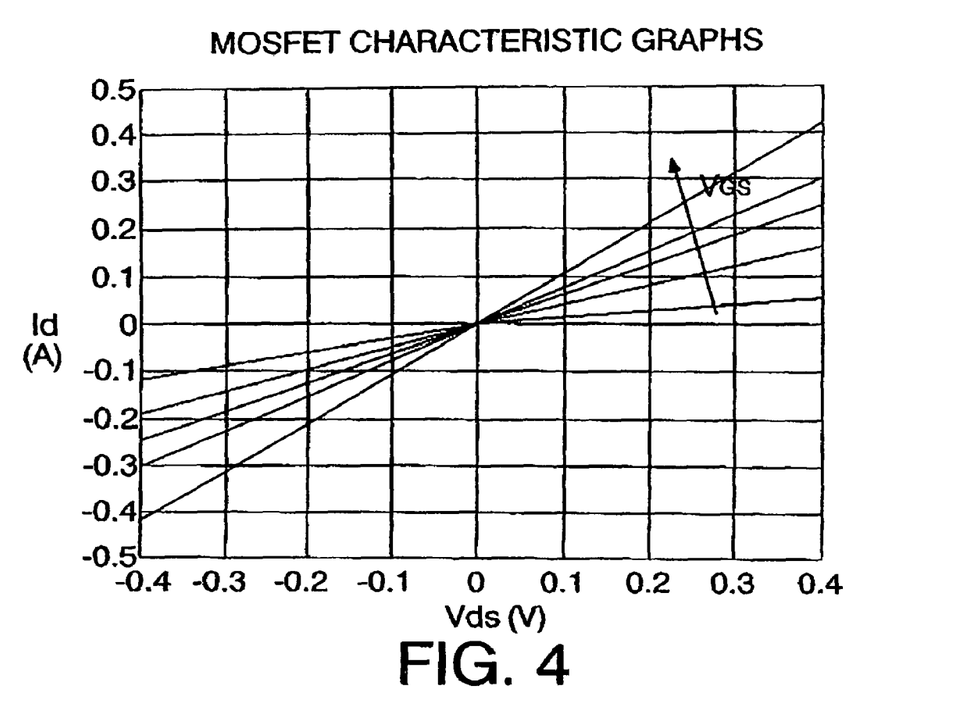
FIG. 4 shows the characteristic curve of the switch with MOSFET indicated in FIG. 3.

FIG. 4 shows the characteristic curve of this switch. As one can see, there are obvious differences with the ideal switch such as the resistance when the switch is on is not zero and the isolation is not infinite when the switch is off.

Figure 5:
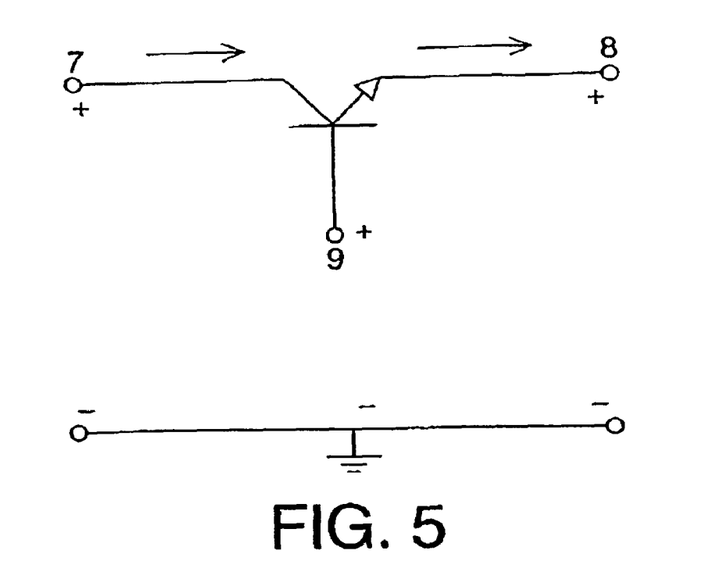
FIG. 5 is a conventional diagram of a switch carried out by a BJT transistor.

On the other hand, the switch can be implemented with a BJT transistor as one can see in FIG. 5. In this case, the voltages and currents of the different terminals correspond with the voltages of the terminals of the BJT transistor (Collector C, Emitter E and Base B):

$$V_{78} = V_{CE} \; V_9 = V_B \; I_7 = I_C$$

In an BJT NPN, the voltage in the base ($V_B$) must exceed the emitter or collector voltage in the threshold value ($V_{Besat}$) so that the switch is on. In this way, if the emitter voltage ($V_E$) is zero, the switch will be on when $V_{BE} > V_{Besat}$ and off when $V_{BE} < V_{BEON}$.

$$V_{Cmax} = V_{cc} - V_{Bcsat}$$

$$V_{Cmin} = -V_{Bcon}$$

The highest limit is determined by the state wherein the switch is on. If the input voltage into the switch exceeds this value, the switch will no longer be on since the condition $V_{BE} > V_{Besat}$ is not met:

$$V_{BC} = V_B - V_C > V_{BC_{SAT}}; \; ON \; V_B = V_{cc}; \; V_{cc} - V_C > V_{BC_{SAT}}$$

The lowest limit is determined by the state wherein the switch is off. If the input voltage is lower than this value, the switch will no longer be off since the condition $V_{BE} < V_{BEon}$ ($V_{BC} < V_{Bcon}$) is not met.

$$V_{BC} = V_B - V_C < V_{BC_{ON}}; \; OFF \; V_B = 0; \; -V_C < V_{BC_{ON}}$$

Therefore, for the switch circuit already known in the prior art with BJT transistor; the total range is $[-V_{Beon}, V_{cc} - V_{BEsat}]$ (approximately $[0, +V_{cc}]$) with a unipolar $+V_{cc}$ source.

Figure 6:
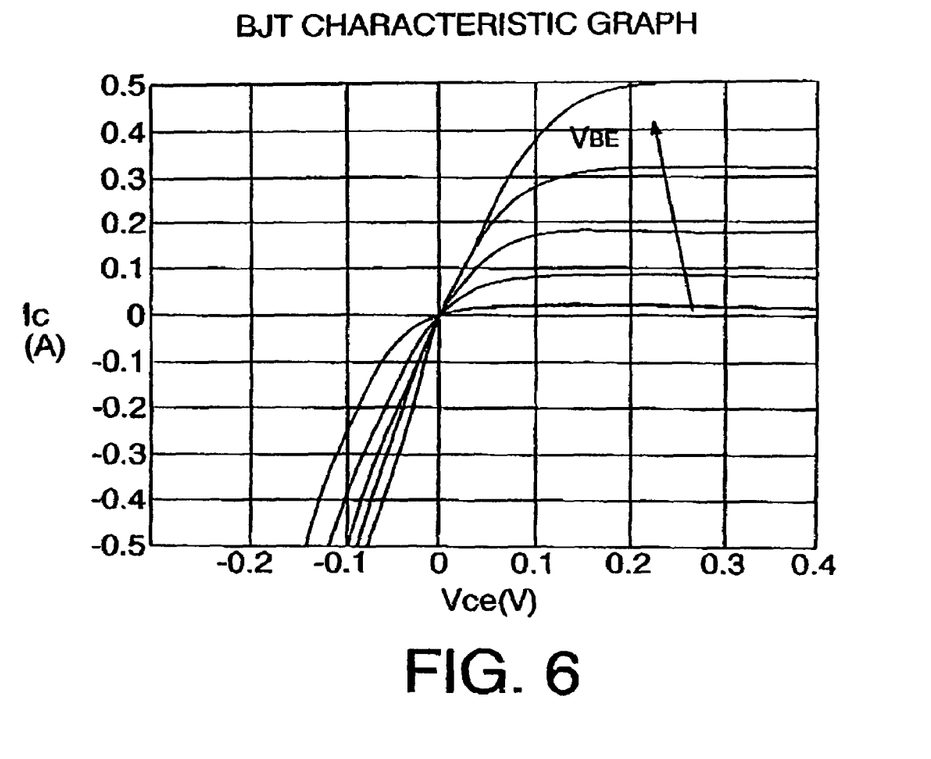
FIG. 6 shows the characteristic curve of the switch with BJT indicated in FIG. 5.

The characteristic curve of the switch in this case can be seen in FIG. 6. This figure shows several curves for different biases ($V_{BE}$). The fact that the source is not zero sticks out therein, due to a certain offset voltage, which is negligible in practice. Furthermore, the switch with BJT is not linear (which limits the dynamic range), it is not symmetric, and it needs a certain current through the control terminal ($I_B$) for which reason the current that circulates through the two terminals to switch will be different ($I_C \neq I_E$).

Figure 7:
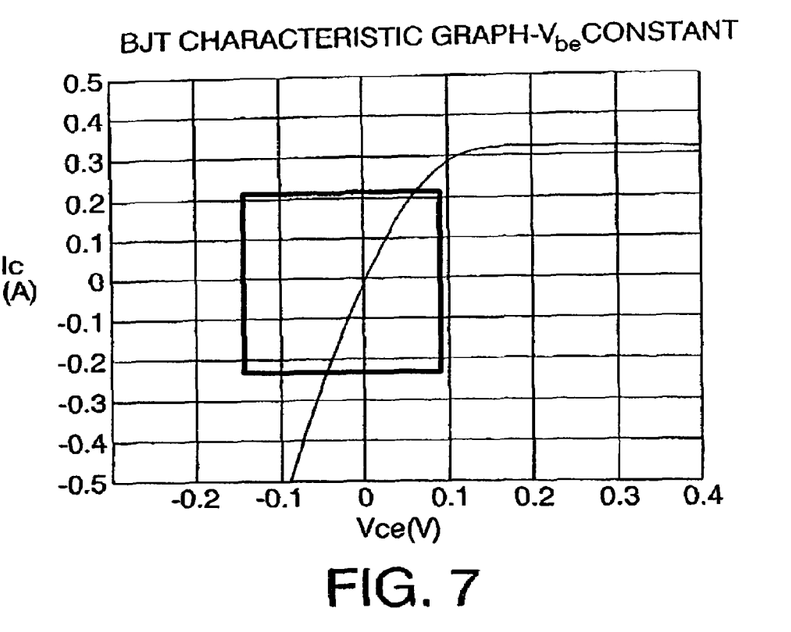
FIG. 7 shows the linear area of the characteristic curve of a switch with BJT for a certain bias.

In general, and for uses in telecommunications that use switches a design that keeps its operation in the almost linear area is necessary. This can be seen in FIG. 7 wherein said area has been squared in for a curve obtained for a certain bias of the transistor.

In short, for a typical switch circuit with BJT it is possible to switch signals with a maximum amplitude equal to half the source voltage (peak-peak level equal to the source voltage). There are multiple uses in telecommunications wherein switching of signals with a higher amplitude must be carried out, whereby in order to use this circuit the appropriate source would have to be provided independently, with the subsequent additional cost.

On the other hand, the circuit of the invention, in other words, the duplicate dynamic range switch permits all of the above-mentioned problems to be solved by achieving switching signals with a peak level equal to the source voltage (peak-peak level double the source) by means of a transistor. There are multiple uses where this type of switch is used, but one of the most appropriate ones is the switching of wide band and high power signals with TDD (Time Division Duplex) technology.

Figure 8:
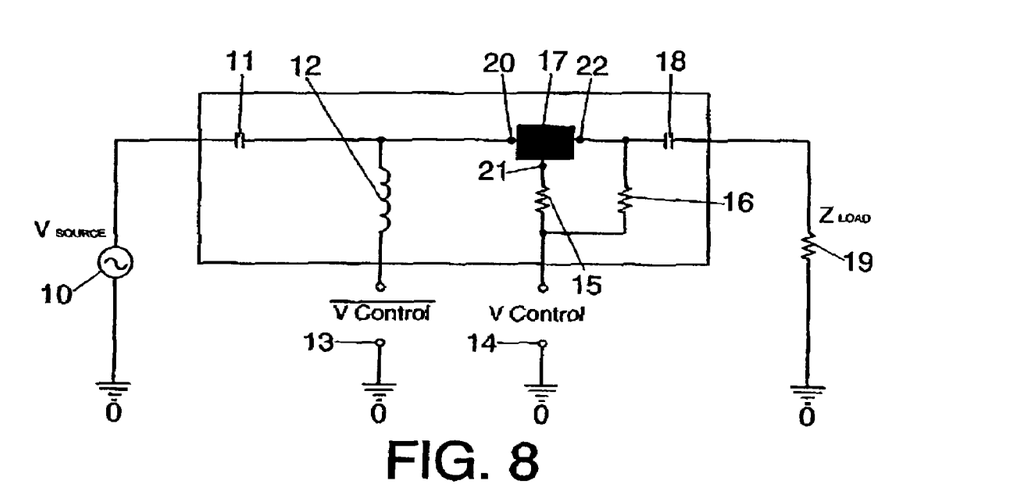
FIG. 8 is a general diagram of the switch circuit of the invention.

A diagram of the switch of the invention can be seen in FIG. 8. The circuit comprises a transistor (17), an inductor (12), two resistors (15) and (16) and two capacitors (11) and (18), located between a signal source ($V_{source}$) (10) and an external load ($Z_{load}$) (19). In order to clarify the connections, the three terminals of the transistor (17) have been marked in this figure with references (20), (21) and (22). In this circuit the source signal ($V_{source}$) (10) is connected to the first terminal (20) of the transistor (17) by means of a capacitor (11), the input for the complementary control voltage ($\overline{VControl}$) (13) to the first terminal (20) of the transistor (17) by means of an inductor (12), the input for the control voltage ($V_{control}$) (14) to the second terminal (21) of the transistor (17) by means of a resistor (15), the input for the control voltage ($V_{control}$) (14) to the third terminal (22) of the transistor (17) by means of another resistor (16), and the third terminal (22) of the transistor (17) to the load ($Z_{load}$) (19) by means of a capacitor (18).

In this figure ($\overline{VControl}$) (13) is the complementary voltage of the control voltage ($V_{control}$) (14) inasmuch as when one of said voltages is an end of the source ($V_{source}$), the other voltage is the other end of the source voltage.

If a unipolar source voltage ($V_{control}$) Of $+V_{cc}$ is assumed, analysis similar to the one made for basic switches and the on and off states thereof can be carried out.

The switch is on when the control voltage ($V_{control}$) (14) is equal to the top extreme of the source voltage ($+V_{cc}$), whereas the complementary voltage ($(\overline{VControl})$ (13) is equal to the bottom extreme of said source (0).

As of this general circuit, it is possible to carry out multiple embodiments replacing the generic transistor by a BJT or MOSFET transistor. In order to explain the operation of the circuit of FIG. 8 a BJT transistor put in place instead of the generic transistor will be used. In this case, the voltages in direct current the terminals of the BJT transistor of the switch circuit of the invention are the following:

$$V_B = +V_{cc} \quad V_{E_{DC}} = 0 \quad V_{C_{DC}} = 0$$

In order to know the dynamic range of the switch, the voltages of the collector and the emitter can be split up into the direct current ($V_{DC}$) and alternating current ($V_{AC}$) components thereof, since the switch is decoupled into alternating current by means of capacitors (11) and (18), that is to say:

$$v_E = V_{E_{DC}} + V_{E_{AC}} = (\overline{(VControl)}) + V_{SOURCE} = V_{SOURCE}$$

$$v_C = V_{C_{DC}} + V_{C_{AC}} = (\overline{(VControl)}) + V_{SOURCE} = V_{SOURCE}$$

Both voltages are equal when the switch is on, ignoring the voltage $V_{CE_{SAT}}$. The condition so that the switch is kept on is the following:

$$V_{BE} > V_{BEsat} V_{BE_{SAT}} (V_{BC} > V_{Bcsat})$$

From these expressions the highest limit of the alternating current input voltage coming from the source is obtained:

$$V_{BE} = V_B - V_E = +V_{cc} - V_{SOURCE} > V_{BE_{SAT}}$$

$$V_{SOURCE} < +V_{cc} - V_{BE_{SAT}}$$

Hence, the maximum voltage that can be switched will be approximately the source voltage $+V_{cc}$.

On the other hand, the switch will be off when the control voltage ($V_{control}$) (14) is equal to the lowest limit of the source voltage (0) and ($(\overline{VControl})$ (13) is equal to the highest limit of the source ($+V_{cc}$).

The voltages in direct current that appear in the terminals of the transistor in this case are the following:

$$V_B = 0 \quad V_{E_{DC}} = +V_{cc}$$

In this case, in order to know the dynamic range of the switch when it is off, it is necessary to obtain the bias in direct current of the collector. This voltage in the moment, in which the transistor is no longer off and goes on, it becomes equal to the voltage of the emitter. Therefore, in order to calculate the limit between off state and the on state when the switch is off, the voltage of the collector is equal to the voltage of the emitter.

In the same way that for the on state, the voltages of the collector and the emitter can be split up in the two components thereof, direct current ($V_{DC}$) and alternating current ($V_{AC}$):

$$V_C = V_{E_{DC}} + V_{E_{AC}} = (\overline{(VControl)}) + v_{SOURCE} = +V_{cc} + v_{SOURCE}$$

$$V_C = V_{C_{DC}} + v_{C_{AC}} = (\overline{(VControl)}) + v_{SOURCE} = +V_{cc} + v_{SOURCE}$$

So that the switch does not stop being off, it is necessary that the following condition is maintained:

$$V_{BE} < V_{Beon} (V_{BC} < V_{Bcon})$$

Expanding this condition the lowest limit of the alternating current input voltage coming from the source is obtained:

$$V_{BE} = V_B - V_E = 0 - (V_{cc} + v_{SOURCE}) < V_{BE_{on}}$$

$$V_{source} > -V_{cc} - V_{BE_{ON}}$$

Hence, the minimum voltage that will be able to be switched is approximately the source voltage but with a negative sign ($-V_{cc}$).

In short, the dynamic range of the source voltage that is capable of switching the circuit of the invention is $[-V_{cc}, +V_{cc}]$ that is double the source voltage (that since it is unipolar it is $[0, +V_{cc}]$). With this one concludes that the invention manages to double the dynamic switching range with respect to other switch circuits known in the prior art.

Figure 9:
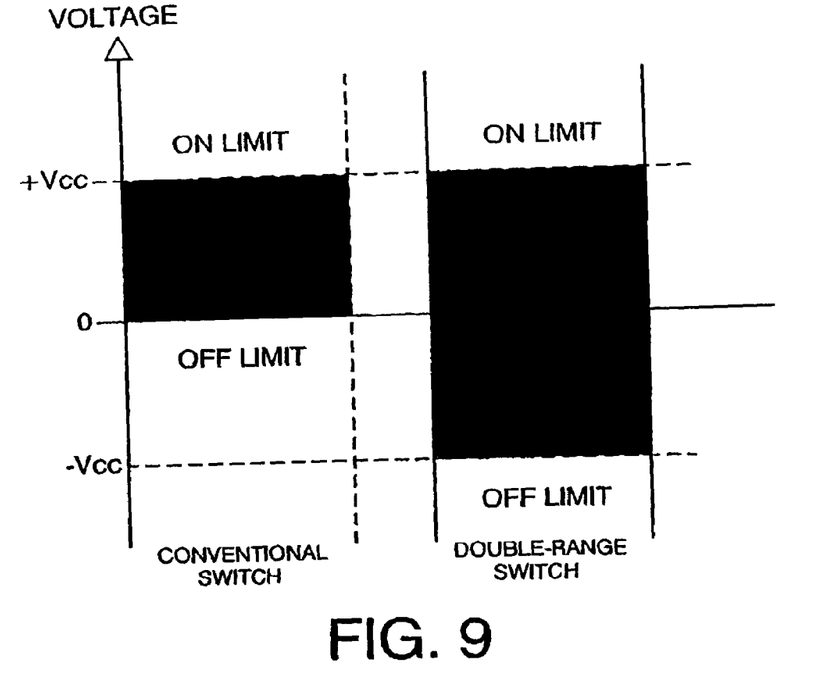
FIG. 9 shows a comparative graph of the switching range in a conventional switch and the double range switch of the invention.

FIG. 9 shows a comparison between the input voltage limits in the case of a conventional switch and in the case of the switch of the invention. The source in both cases is unipolar from 0 to $+V_{cc}$. As shown in the figure, the conventional switch has a range between its on and off limits equal to the source, whereas for the circuit of the invention, the range is double this value, thanks to the correct use of the control signals that cause the change of bias in the switching transistor.

On the other hand, the BJT transistor, due to its construction, is not perfectly symmetric, but for a use such as switching it can assume its symmetry from the point of view of the bias. In other words, the bias can be carried out from the Base to the Emitter (as traditionally done) or from the Base to the Collector, without there being big differences of performance as to the use thereof in the switching process. Better results will be obtained with one configuration or the other depending on the characteristics themselves of the transistor used, although said differences will be minimal.

With the bias between the Base and the Collector, when the switch is on, the transistor, in direct current (that is to say, statically), it will be biased in reverse saturation. Once the alternating current signal appears from the source, the bias of the transistor will change from reverse saturation to direct saturation alternatively depending on the input voltage into the switch (or of the direction of the current in the load). The latter also takes place in the case of using traditional bias of the transistor between the Base and the Emitter.

Figure 10:
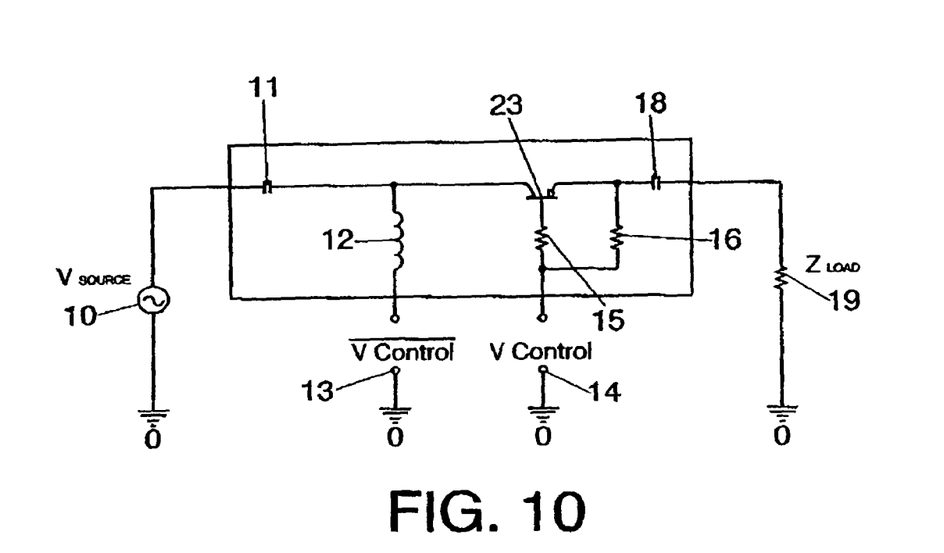
FIG. 10 is a particular embodiment of the invention wherein the transistor used is a reverse biased BJT NPN transistor.

FIG. 10 shows the switch circuit with a duplicate dynamic range of the invention, but with a reverse biased BJT NPN transistor (23). The operation and characteristics are essentially the same as for the above-shown switch, which can be demonstrated by replacing the voltage of the Emitter by the voltage of the Collector in the above operating equations, as far as the dynamic input range of the switch is concerned.

Figure 11:
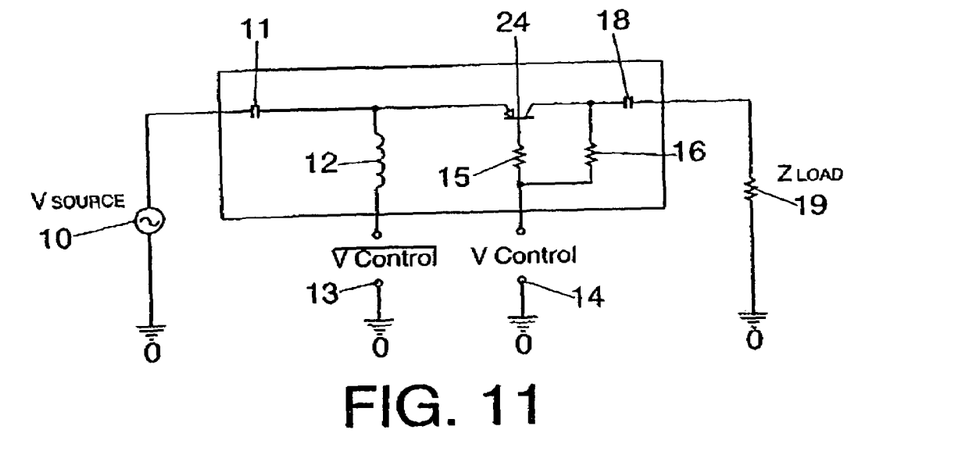
FIG. 11 is a particular embodiment wherein the transistor used is a direct biased BJT NPN transistor.
Figure 12:
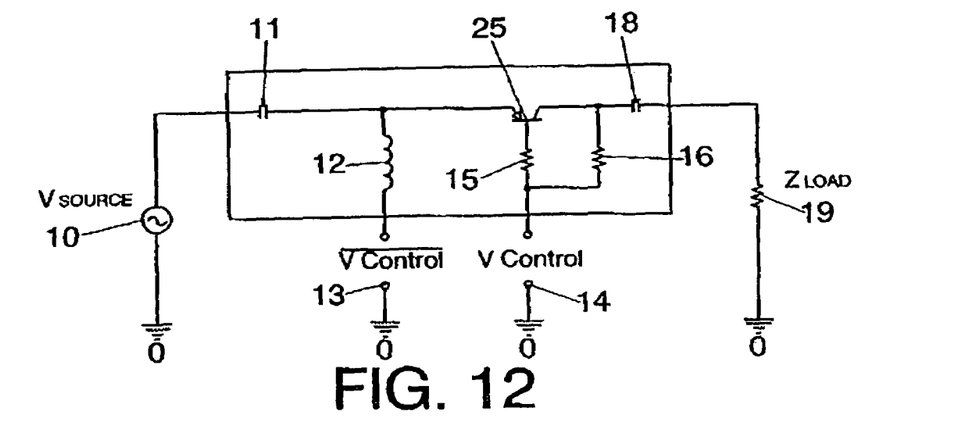
FIG. 12 is a particular embodiment wherein the transistor used is a direct biased BJT PNP transistor.
Figure 13:
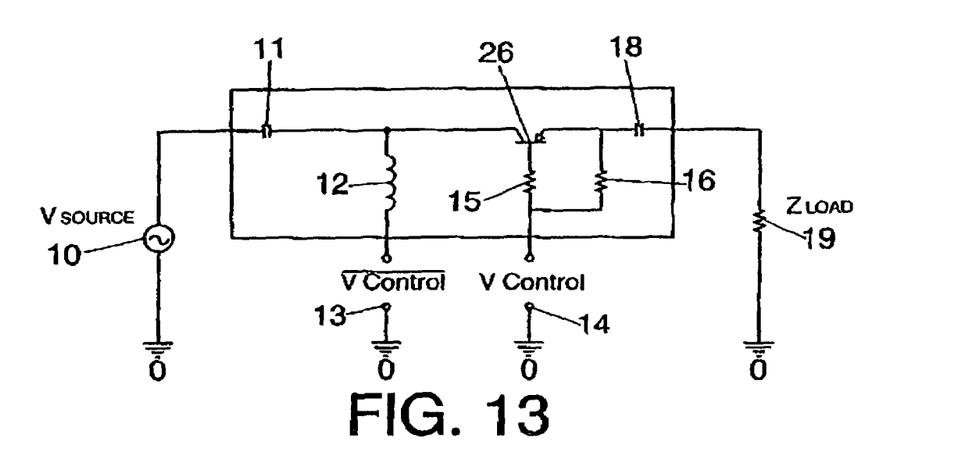
FIG. 13 is a particular embodiment wherein the transistor used is a reverse biased BJT PNP transistor.

FIG. 11 shows another embodiment of a switch according to the invention with a BJT NPN transistor (24) but this time directly biased, whereas FIG. 12 shows an embodiment wherein the transistor used is a directly biased BJT NPN (25), and FIG. 13 is another embodiment wherein the transistor used in a reverse biased BJT NPN (16).

Figure 14:
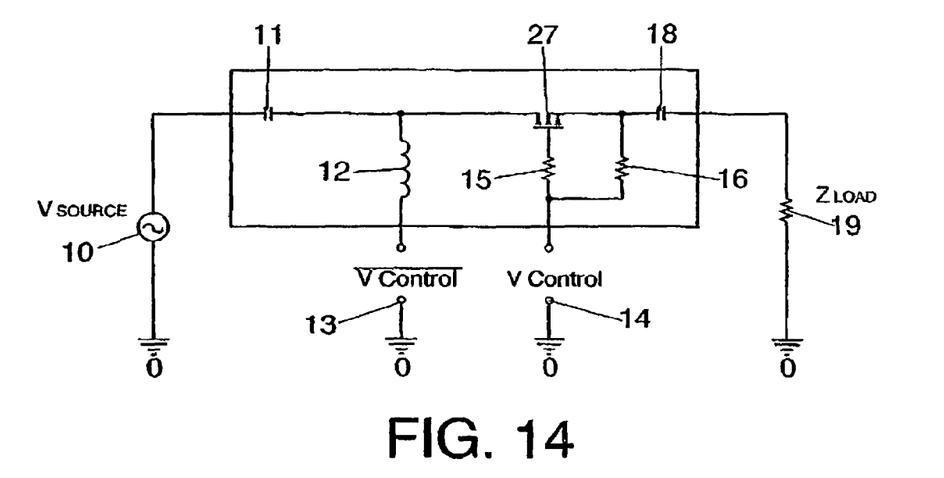
FIG. 14 is a particular embodiment wherein the transistor used is an N channel MOSFET transistor.
Figure 15:
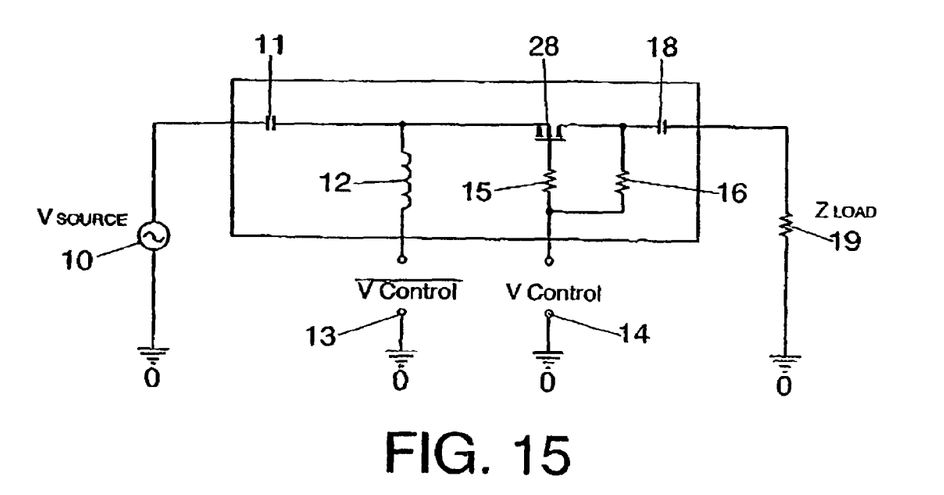
FIG. 15 is a particular embodiment wherein the transistor used is a P channel MOSFET transistor.

Finally, FIGS. 14 and 15 show particular embodiments wherein a MOSFET transistor is used. FIG. 14 shows an embodiment with an N channel MOSFET transistor (27), whereas FIG. 15 shows an embodiment with a P channel MOSFET transistor (28).

The invention claimed is:

1. Switch circuit to obtain a duplicate dynamic range, which comprises a transistor (17) with three terminals (20, 21 and 22), an inductor (12), two resistors (15 and 16) and two capacitors (11 and 18), located between a signal source ($V_{SOURCE}$) (10) and an external load ($Z_{load}$) (19) characterized in that it comprises:
    connecting the signal source ($V_{source}$) (10) to the first terminal (20) of the transistor by means of a capacitor (11);
    connecting an input of complementary control voltage ($\overline{VControl}$) (13) to the first terminal (20) of the transistor (17) by means of an inductor (12);
    connecting an input of control voltage ($V_{control}$) (14) to the second terminal (21) of the transistor (17) by means of a resistor (15);
    connecting an input of control voltage ($V_{control}$) (14) to the third terminal (22) of the transistor by means of another resistor (16);
    connecting the third terminal (22) of the transistor (17) to the load ($Z_{load}$) by means of a capacitor (18); and
    applying a control voltage ($V_{control}$) (14) and its complementary control voltage ($\overline{VControl}$) (13) to the switch circuit;
in order to achieve a dynamic range in the switching double the range of the source voltage.

2. Switch circuit to obtain a duplicate dynamic range, according to claim 1, characterized in that the transistor used is a reverse biased BJT transistor.

3. Switch circuit to obtain a duplicate dynamic range, according to claim 1, characterized in that the transistor used is a direct biased BJT transistor.

4. Switch circuit to obtain a duplicate dynamic range, according to claim 1, characterized in that the transistor used is an N channel MOSFET transistor.

5. Switch circuit to obtain a duplicate dynamic range, according to claim 1, characterized in that the transistor used is a P channel MOSFET transistor.

6. Switch circuit to obtain a duplicate dynamic range, according claim 2, characterized in that for the cases wherein the transistor is a BJT NPN or N channel MOSFET one, when the voltage control ($V_{control}$) (14) is equal to the highest limit of the source voltage, the complementary control voltage ($\overline{VControl}$) (13) is equal to the lowest limit of the source supply and the switch is on, whereas when the voltage control ($V_{control}$) (14) is equal to the lowest limit, the complementary control voltage ($\overline{VControl}$) (13) is equal to the highest limit and the switch is off.

7. Switch circuit to obtain a duplicate dynamic range, according to claim 2, characterized in that for the cases wherein the transistor is a BJT PNP or P channel MOSFET, when the voltage control ($V_{control}$) (14) is equal to the highest limit of the source voltage, the complementary control voltage ($\overline{VControl}$) (13) is equal to the lowest limit of the source voltage and the switch is off, whereas when the control voltage ($V_{control}$) (14) is equal to the lowest limit, the complementary control voltage ($\overline{VControl}$) (13) is equal to the highest limit and the switch is on.

8. Switch circuit to obtain a duplicate dynamic range, according to claim 1, characterized in that a unipolar source is applied to the switch circuit.

9. Switch circuit to obtain a duplicate dynamic range, according to claim 1, characterized in that a bipolar source is applied to the switch circuit.

10. Switch circuit to obtain a duplicate dynamic range, according claim 3, characterized in that for the cases wherein the transistor is a BJT NPN or N channel MOSFET one, when the voltage control ($V_{control}$) (14) is equal to the highest limit of the source voltage, the complementary control voltage ($\overline{VControl}$) (13) is equal to the lowest limit of the source supply and the switch is on, whereas when the voltage control ($V_{control}$) (14) is equal to the lowest limit, the complementary control voltage ($\overline{VControl}$) (13) is equal to the highest limit and the switch is off.

11. Switch circuit to obtain a duplicate dynamic range, according claim 4, characterized in that for the cases wherein the transistor is a BJT NPN or N channel MOSFET one, when the voltage control ($V_{control}$) (14) is equal to the highest limit of the source voltage, the complementary control voltage ($\overline{VControl}$) (13) is equal to the lowest limit of the source supply and the switch is on, whereas when the voltage control ($V_{control}$) (14) is equal to the lowest limit, the complementary control voltage ($\overline{VControl}$) (13) is equal to the highest limit and the switch is off.

12. Switch circuit to obtain a duplicate dynamic range, according to claim 3, characterized in that for the cases wherein the transistor is a BJT PNP or P channel MOSFET, when the voltage control ($V_{control}$) (14) is equal to the highest limit of the source voltage, the complementary control voltage ($\overline{VControl}$) (13) is equal to the lowest limit of the source voltage and the switch is off, whereas when the control voltage ($V_{control}$) (14) is equal to the lowest limit, the complementary control voltage ($\overline{VControl}$) (13) is equal to the highest limit and the switch is on.

13. Switch circuit to obtain a duplicate dynamic range, according to claim 5, characterized in that for the cases wherein the transistor is a BJT PNP or P channel MOSFET, when the voltage control ($V_{control}$) (14) is equal to the highest limit of the source voltage, the complementary control voltage ($\overline{VControl}$) (13) is equal to the lowest limit of the source voltage and the switch is off, whereas when the control voltage ($V_{control}$) (14) is equal to the lowest limit, the complementary control voltage ($\overline{VControl}$) (13) is equal to the highest limit and the switch is on.

14. Switch circuit to obtain a duplicate dynamic range, according to claim 2, characterized in that a unipolar source is applied to the switch circuit.

15. Switch circuit to obtain a duplicate dynamic range, according to claim 3, characterized in that a unipolar source is applied to the switch circuit.

16. Switch circuit to obtain a duplicate dynamic range, according to claim 4, characterized in that a unipolar source is applied to the switch circuit.

17. Switch circuit to obtain a duplicate dynamic range, according to claim 5, characterized in that a unipolar source is applied to the switch circuit.

18. Switch circuit to obtain a duplicate dynamic range, according to claim 6, characterized in that a unipolar source is applied to the switch circuit.

19. Switch circuit to obtain a duplicate dynamic range, according to claim 7, characterized in that a unipolar source is applied to the switch circuit.

20. Switch circuit to obtain a duplicate dynamic range, according to claim 2, characterized in that a bipolar source is applied to the switch circuit.

21. Switch circuit to obtain a duplicate dynamic range, according to claim 3, characterized in that a bipolar source is applied to the switch circuit.

22. Switch circuit to obtain a duplicate dynamic range, according to claim 4, characterized in that a bipolar source is applied to the switch circuit.

23. Switch circuit to obtain a duplicate dynamic range, according to claim 5, characterized in that a bipolar source is applied to the switch circuit.

24. Switch circuit to obtain a duplicate dynamic range, according to claim 6, characterized in that a bipolar source is applied to the switch circuit.

25. Switch circuit to obtain a duplicate dynamic range, according to claim 7, characterized in that a bipolar source is applied to the switch circuit.

* * * * *